United States Patent [19]

Craven et al.

[11] 3,965,446

[45] June 22, 1976

[54] SURFACE ACOUSTIC WAVE FILTER

[75] Inventors: George Frederick Craven, Heath; John Stuart Heeks, Harlow; Graham Marshall, Malvern, all of England

[73] Assignee: International Standard Electric Corporation, New York, N.Y.

[22] Filed: Feb. 24, 1975

[21] Appl. No.: 552,410

[30] Foreign Application Priority Data
Mar. 5, 1974 United Kingdom............... 9767/74

[52] U.S. Cl.................................. 333/72; 310/9.8; 333/30 R
[51] Int. Cl.²..................... H03H 9/26; H03H 9/30; H03H 9/32; H03H 9/04
[58] Field of Search............. 333/30 R, 72; 310/9.7, 310/9.8, 8.0, 8.1, 8.2

[56] References Cited
UNITED STATES PATENTS

| | | | |
|---|---|---|---|
| 3,716,809 | 2/1973 | Reeder et al.................. | 333/30 R X |
| 3,781,717 | 12/1973 | Kuenemund..................... | 333/72 X |
| 3,836,876 | 9/1974 | Marshall et al.................. | 333/72 X |
| 3,882,430 | 5/1975 | Maerfeld.......................... | 333/30 R |
| 3,886,504 | 5/1975 | Hartmann et al.................... | 333/72 |

*Primary Examiner*—Alfred E. Smith
*Assistant Examiner*—Marvin Nussbaum
*Attorney, Agent, or Firm*—John T. O'Halloran; Menotti J. Lombardi, Jr.

[57] ABSTRACT

This invention comprises in combination a body of piezoelectric material, means for propagating an acoustic wave in a first mode, means for converting a portion of the acoustic wave energy into an acoustic wave in a second mode, a resonant structure in which the acoustic wave energy in the second mode is resonant, means for reconverting the acoustic wave energy in the second mode into surface acoustic wave energy in the first mode, means for providing a predetermined phase shift of the reconverted acoustic wave energy relative to the original propagated acoustic wave energy, and means for recovering the combined acoustic wave energy of the original and phase shift reconverted acoustic wave energies as an electric output signal.

9 Claims, 15 Drawing Figures

SURFACE ACOUSTIC WAVE FILTER

FIELD OF THE INVENTION

This invention relates to surface acoustic wave filter devices.

BACKGROUND OF THE INVENTION

The generation of acoustic waves in the surface of a body of piezoelectric material has been described, inter alia, in the IEEE Transactions on Microwave Theory and Techniques, Vol. MTT-17 No. 11, November 1969, at page 845, entitled "The Generation and Propagation of Acoustic Surface Waves at Microwave Frequencies". On a per wavelength basis the transmission loss for acoustic waves is less than that for corresponding electromagnetic waves in TEM or waveguide media.

Transducers for launching and recovering surface acoustic waves have been developed. One form of transducer is that known as the interdigital transducer. The efficiency of the interdigital transducer is enhanced when two or more pairs of such transducers are used in an interlaced structure, with all the input transducers connected in parallel electrically, likewise the output transducers. With large numbers of pairs of transducers in an interlaced structure extremely low loss devices can be fabricated.

Conventional electrical transmission line filters comprise circuit elements consisting of capacitive and inductive obstacles, short circuit and open circuit terminations and similar devices. Capacitive and inductive obstacles in a waveguide or transmission line exhibit their properties because of the stored energy (electric or magnetic) associated with the evanescent modes which they excite. However, in surface acoustic wave devices obstacles to an acoustic wave excite many new modes which are non-evanescent and thus the effect is one of mode conversion.

SUMMARY OF THE INVENTION

The purpose of the present invention is to provide filters in surface acoustic wave devices utilizing the techniques of the phenomenon known as mode-conversion-reconversion and comprises a surface acoustic wave filter device including a body of piezoelectric material, means for propagating from an input electric signal an acoustic wave in a first mode in the surface of the body, means for converting a portion of the surface acoustic wave energy into an acoustic wave in a second mode, a resonant structure in which the acoustic wave energy in the second mode is resonant, means for reconverting the acoustic wave energy in the second mode into surface acooustic wave energy in the first mode, means for introducing a predetermined phase shift of the reconverted acoustic wave energy relative to the originally propagated acoustic wave energy, and means for recovering as an electric output signal the combined acoustic wave energy of the original and phase shifted reconverted acoustic wave energies.

The above and other features of the invention will now be described with reference to the accompanying drawings, in which:

BRIEF DESCRIPTION OF THE DRAWINGS

FIGS. 7b and 7c are schematic representations of a multi-section filter structure based on the structure illustrated in FIG. 7a.

DESCRIPTION OF THE PREFERRED EMBODIMENT

Figure 1A:
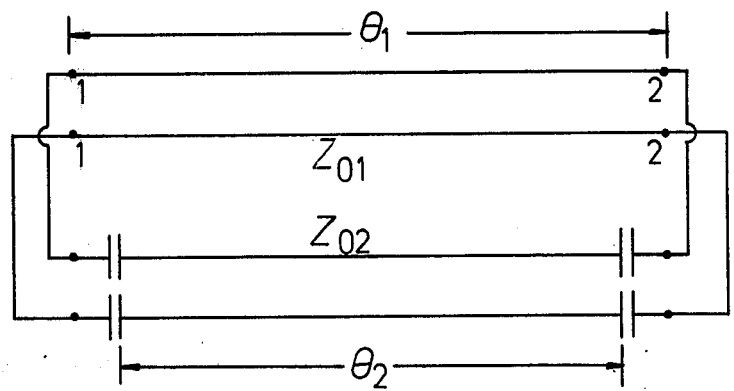
FIGS. 1a and 1b are schematic representations of mode-conversion-reconversion phenomenon as applied to filters.
Figure 1B:
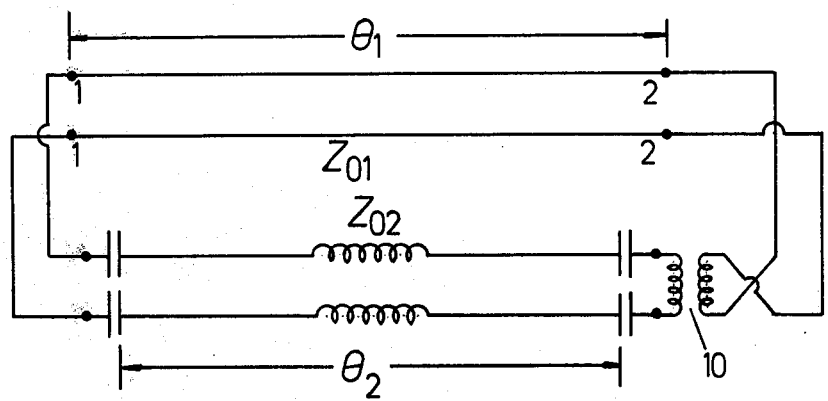

Mode-conversion is a reciprocal phenomenon and, therefore, if some of the power in a surface acoustic wave is converted to a new mode by an obstacle, power in the new mode will be reconverted back into the surface wave when it encounters a similar obstacle. The fraction of the available power converted and reconverted in this way may be quite negligible under ordinary circumstances, but if resonance is also associated with the conversion-reconversion process the effect on the transmission of the main mode may be considerable. The phenomenon is general to wave transmission in guided media and may be understood with the aid of FIGS. 1a and b: $Z_{o1}$ $\theta_1$ represents the characteristics of the main mode, $Z_{o2}$, $\theta_2$ representing the characteristics of the converted mode, which it is assumed is weakly coupled to the main mode. If the coupling is assumed to be very weak then the capacitive loading will be negligible ($c$ very small) and the first symmetrical resonance which can occur results when the line is almost exactly (because the capacitive loading is small) a half wavelength long. Under these circumstances the simplified equivalent circuit of FIG. 1b is appropriate and the weakly coupled resonator may be represented by a series resonant circuit with a transformer 10 which inverts the phase. Clearly the voltage between points 2—2 is the resultant of two waves which have traveled via the separate routes $\theta_1$ and $\theta_2$. It is assumed that $\theta_1$ is greater than $\theta_2$ the difference between them being $\pi$ at resonance. Thus, at resonance the voltages will be equal and opposite (as a result of the $\pi$ difference in path length) and total reflection will result. At frequencies which differ slightly from resonance, as a consequence of the weak coupling little energy will be converted into the second mode and thus, the effect on the main mode will be small.

Figure 2A:
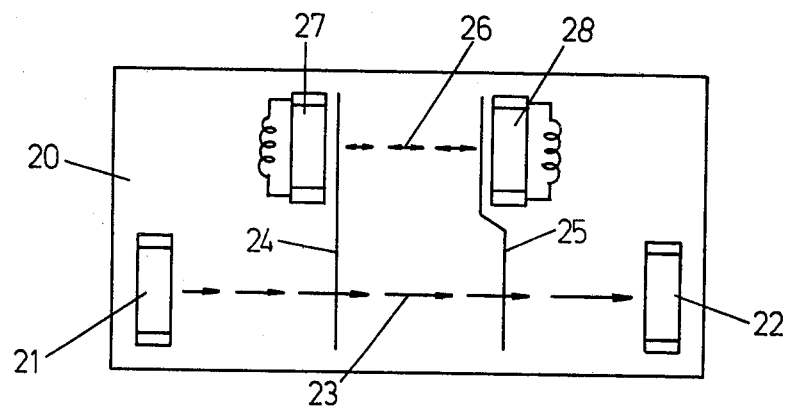
FIGS. 2a and 2b are schematic representations of a mode-conversion-reconversion surface acoustic wave filter.

The simplest structure in which mode-conversion-reconversion may be employed is shown in FIG. 2a. A slice of piezoelectric material 20 is provided with interdigital input and output transducers 21 and 22 respectively. A surface acoustic wave launched from transducer 21 is propagated along the path 23 (indicated by the arrows) and is recovered at transducer 22. There are also two directional coupling elements 24 and 25. These are single strips of metal deposited on the piezoelectric material surface and each strip extends across the path 23 and across a second path 26. Metal strip 24 excites a second surface acoustic wave in the second path 26 (i.e. conversion to a second mode). Two interdigital transducers 27 and 28, each tuned by an inductance, are placed in the line of the second path 26, with the strips 24, 25 between the transducers. The positions of the transducers 27 and 28 are such that they form a resonant cavity, each tuned transducer effectively forming a totally reflecting termination of the second path 26. While the energy transferred to path 26 by coupling strip 24 may be very weak, this is trapped in the resonant structure and, at the relevant frequency, the energy in the path 26 is built up. The second coupling strip 25 transfers a portion of the resonant energy from path 26 to path 23 (i.e. reconversion to the first mode). The coupling strip 25 incorporates a stagger between the lines of the two paths and so introduces a 180° phase shift into the reconverted energy. This phase shifted reconverted energy is thus combined with the original surface acoustic wave energy in path 23.

Figure 2B:
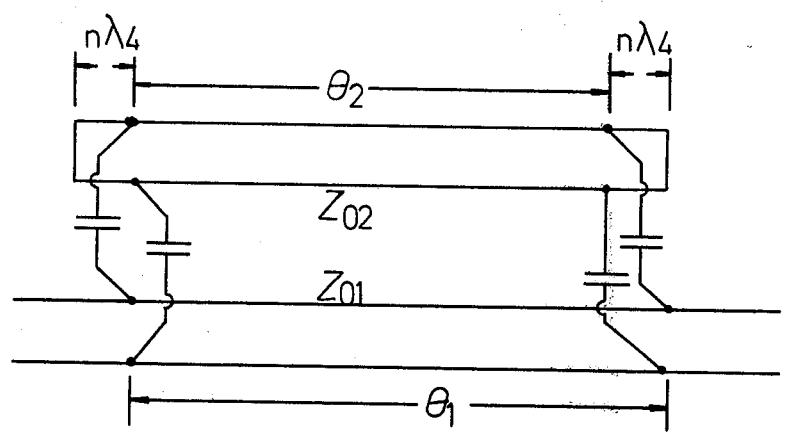

In its essentials this structure realizes the equivalent circuit of FIG. 1 in practical form. One obvious difference is the presence of the two tuned transducers which provide total reflection, no such elements being shown in the basic equivalent circuit of FIG. 1. The reason for this difference is that the 'obstacles' which excite the second mode in FIG. 1 (the capacitive elements) also 'trap' the mode, whereas the strips shown in FIG. 2a do not. In this respect FIG. 1 and FIG. 2a may be regarded as representing examples of 'series' mode conversion and 'shunt' mode conversion respectively. In either case, however, the basic equivalent circuit remains the same. FIG. 1 being only slightly modified by the necessity of introducing reflecting elements into the equivalent circuit (FIG. 2b). Examples in which the trapping of the converted mode is intrinsic to the mode conversion will be described later.

Figure 3:
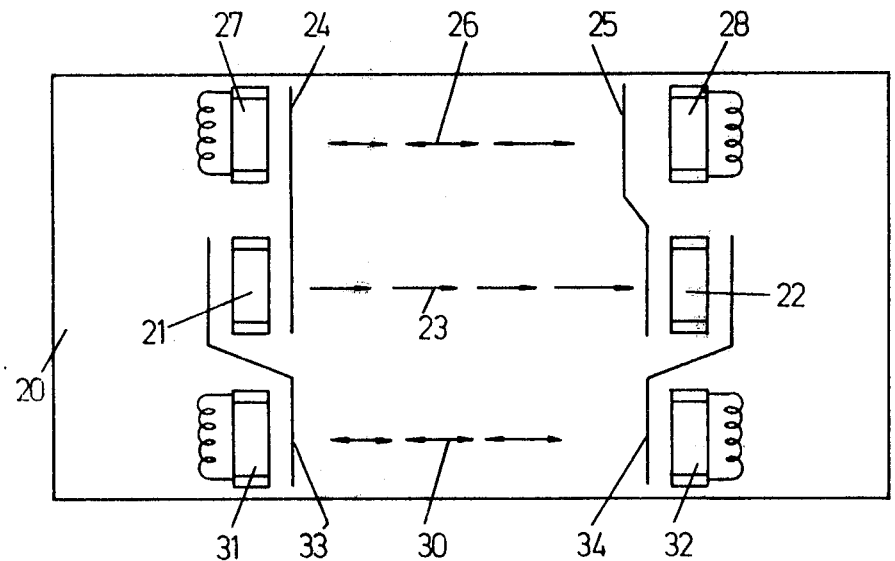
FIG. 3 is a schematic representation of the structure shown in FIG. 2a in which the losses due to the bi-directional properties of the interdigital transducers are eliminated.

A modification of the structure of FIG. 2a can be used to eliminate the 3dB loss (6dB for electric-acoustic-electric transduction) which is intrinsic in the bi-directionality of an interdigital transducer. The modification is shown in FIG. 3, paths 23 and 26 being identical with those shown in FIG. 2a. A third pair of tuned transducers 31, 32 couples into the wave that will be propagated to the left by the input transducer 21, via the staggered coupling strip 33. The resonant energy in path 30 is coupled back to path 23 by the staggered strip 34.

The resonant circuit of path 30 is tuned to the same frequency as the one formed by coupling paths 23 and 26 together. Thus, at resonance the two waves excited by the individual halves of the transducer are reflected back into the transducer. The staggers in the strips 33 and 34 must differ by the amount required to introduce the necessary 180° phase shift.

Figure 4A:
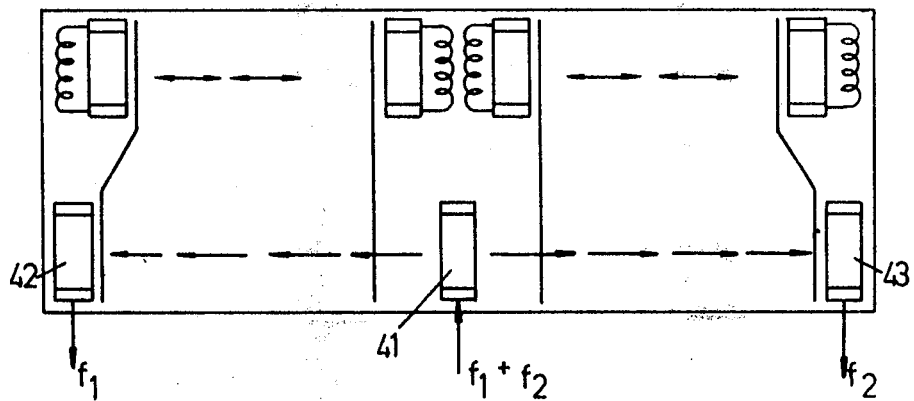
FIGS. 4a, 4b and 4c are schematic representations of a surface acoustic wave structure used as a diplexer.
Figure 4B:
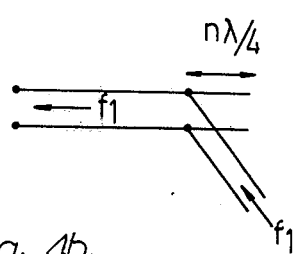
Figure 4C:
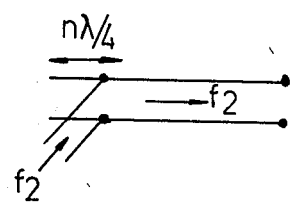

Band-rejection filters have considerable value in their own right, especially when a narrow band of frequencies needs to be eliminated from a wide band. However, they can also be used in diplexers, to separate the two frequencies involved, in place of the more usual bandpass filter. The principles of the diplexer are evident from FIG. 4a, band-rejection filters of the type already described being located to the left and right, respectively, of a central input transducer 41. The bandrejection filter on the right is tuned to $f_1$, the corresponding filter on the left being tuned to $f$. Thus, power at $f_2$ is reflected to the right hand output transducer 42, power at $f_1$ being reflected to the left hand transducer 43. If, additionally, the plane at which total reflection occurs (i.e. the location of the equivalent short-circuit) is correctly chosen relative to the input tranducer, then the equivalent circuit at each frequency simplifies to those shown in FIGS. 4b and 4c, with n in each case being an odd number. The diplexer may then be easily matched at $f_1$ and $f_2$.

Figure 5A:
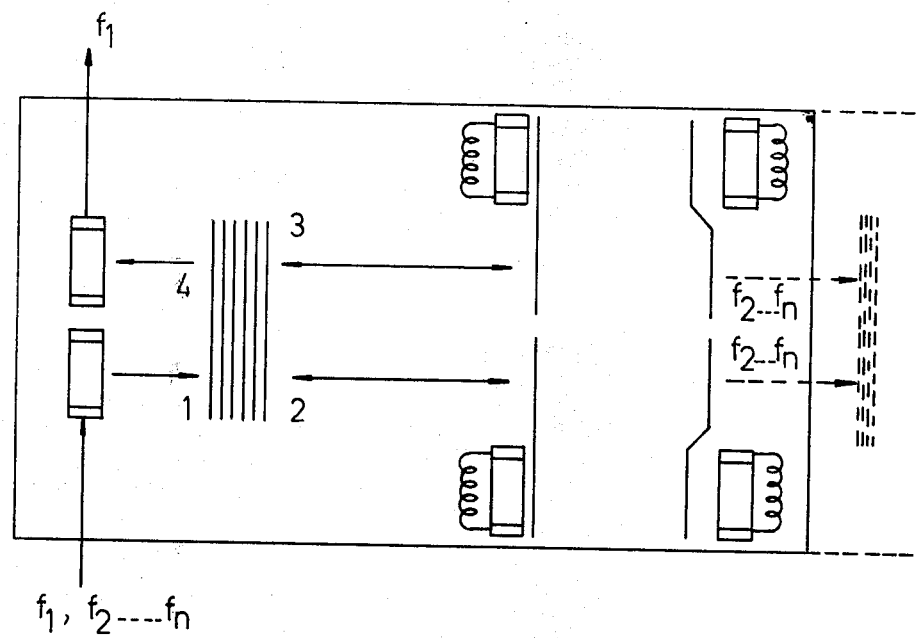
FIG. 5a is a schematic representation of a surface acoustic wave structure with band-rejection filters used as a band-pass device.
Figure 5B:
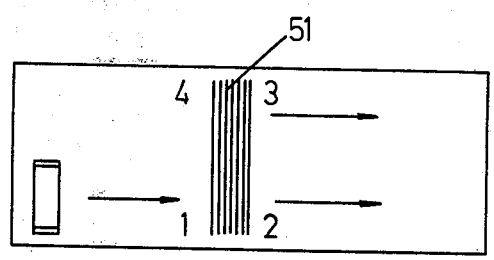
FIGS. 5b and 5c are schematic representations of 3dB multi-strip directional couplers.
Figure 5C:
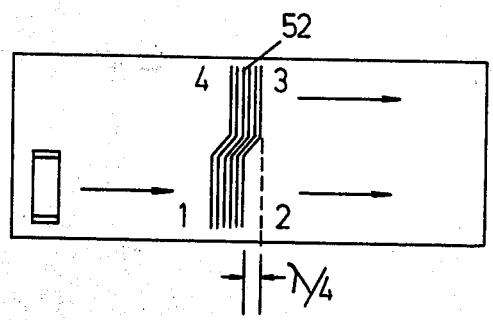

A well known technique in the microwave art permits band-pass characteristics to be realized with band-rejection filters. Its realization in surface acoustic wave form is shown in FIG. 5a, using a multistrip directional coupler. The multi-strip directional coupler is the surface acoustic wave equivalent of the waveguide hybrid-T (or magic-T) junction. A 3dB directional coupler and a hybrid-T junction have the common property of a matched four port junction (FIG. 5b) that any given port couples equal power to two other ports with zero coupling to the fourth port. The basic difference lies in the relative phase of the coupled waves at corresponding planes. In the 3dB coupler 51 of FIG. 5b the coupled waves propagated from ports 2 and 3 are, at equidistant planes from the input plane, in quadrature. In the 3dB coupler 52 of FIG. 5c the strips constituting the coupler are staggered by an amount equal to λ/4 and the coupled waves are then in phase at the equidistant planes. If the stagger were in the opposite direction the coupled waves would be in anti-phase.

In the arrangement shown in FIG. 5a identical band-rejection filters of the type already discussed are located at equal distances from the directional coupler ports 2 and 3. At the desired frequency these filters reflect the wave back into the coupling region, which introduces a 90° phase shift (a necessary condition for directivity) in the wave traveling through this region. Thus, the two waves add in arm 4 and cancel in arm 1. Filters of this type are known as constant resistance channel dropping filters and thus can be connected in cascade on the one substrate to drop off a number of different channels, as indicated by the dotted lines.

Figure 6:
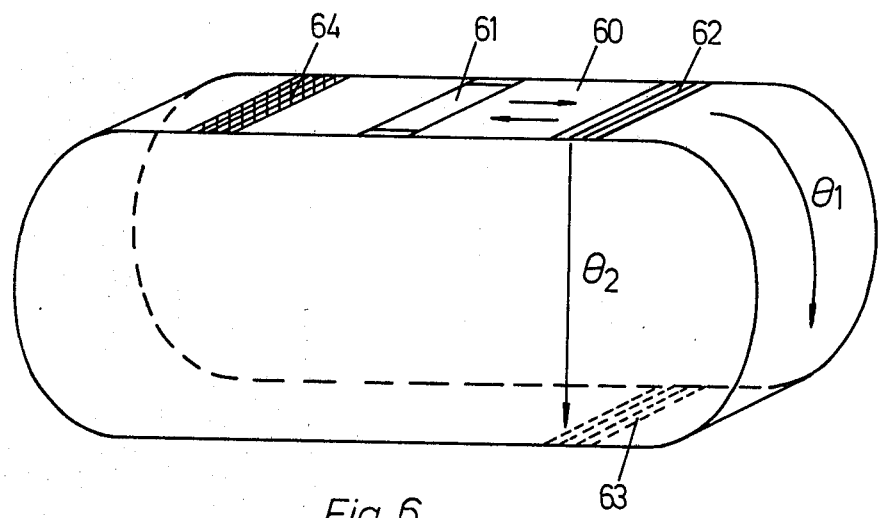
FIG. 6 is a schematic representation of a mode-conversion-reconversion filter structure in which the surface acoustic waves are converted to and reconverted from bulk waves.

So far the mode-conversion filters have been of a simple type employing conversion of a first surface wave mode on one part of a substrate to a second surface wave mode on another part of the same substrate. The filter illustrated in FIG. 6 utilizes surface wave to bulk-wave conversion, resonance in the latter mode, followed by reciprocal reconversion back into the surface wave mode.

An interdigital transducer 61 launches a surface wave which encounters a grating 62 cut in the surface. The grating weakly launches a bulk mode which travels through the material 60 and encounters an identical grating 63 on the other side of the material. This weakly excites a surface wave at all frequencies except that resonant at the distance between 62 and 63 at which the excitation of a surface wave is very strong. Part of the surface wave initially launched by the transducer 61 travels the longer distance round the curved end of the material 60 and reaches the same plane as the reconverted surface wave at grating 63. If the relationships already discussed are satisfied total reflection at this plane will occur. The transducer acts as both input and output and the bi-directionality of the input surface wave is obviated by the use of an absorbing load 64.

It will be seen that the type of mode-conversion employed in this structure corresponds to series mode conversion, the mode being inherently trapped by the conversion process. The basic advantage of this realization of the equivalent circuit lies in the extremely high unloaded Q factor which is obtainable in resonators of this type. The figure has been simplified by showing only one filter, but the application of the scheme to diplexing and similar schemes, as discussed earlier, is obvious.

Figure 7A:
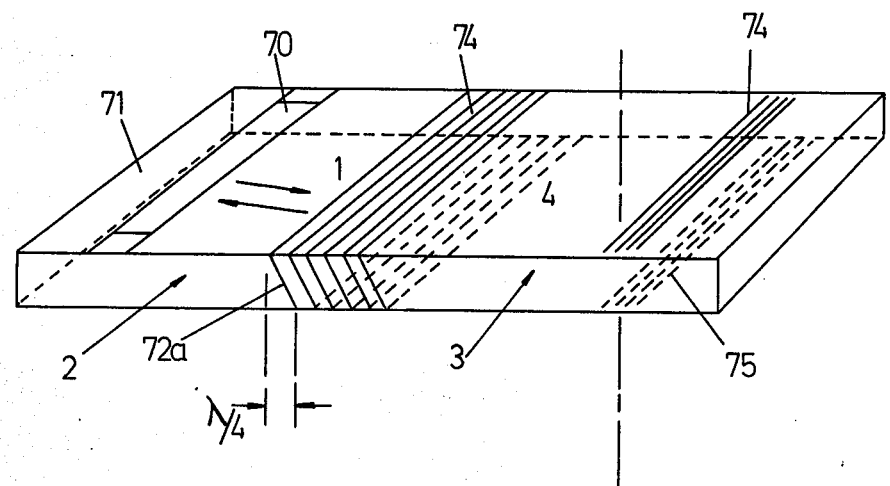
FIG. 7a is a schematic representation of a surface acoustic wave filter structure utilizing a multi-strip coupler.

FIG. 7a shows the first stage of a structure which can be developed to provide a multi-section band-rejection filter using the properties of the 3dB multi-strip coupler. In this case the input transducer 70 extends almost completely across the width of a narrow strip of piezoelectric material 71. The 3dB multi-strip coupler 72 extends across both major faces of the strip 71, the portion on the upper surface (as drawn) providing ports 1 and 2 and the portion on the lower surface ports 3 and 4. The upper and lower portions of the coupler are staggered (i.e. not equidistant from a plane through the transducer) by a distance equal to λ/4 and are connected by the angled portions 72a of the coupler strips on the near edge of the strip 71. Upper and lower gratings 74 and 75 are provided on the upper and lower surfaces respectively, equidistant from a plane passing through the transducer. The principle is the same as in the case of FIG. 5a.

If the waves at the planes shown A-A are antiphase then a surface-bulk mode conversion resonator will produce complete reflection if it is one wavelength (or a multiple thereof) long. If the waves are in phase - as they would be if ports 3 and 4 were the relevant ports and port 2 was the port of excitation — then the length of the resonator will have to be an odd multiple of one half wave long (in order to realize the phase inversion required).

Figure 7B:
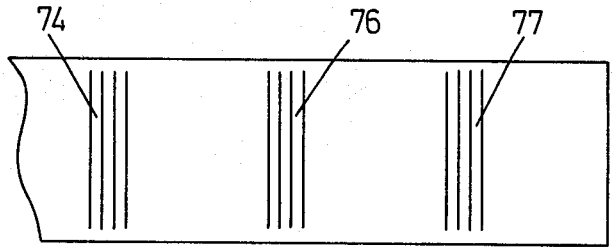
Figure 7C:
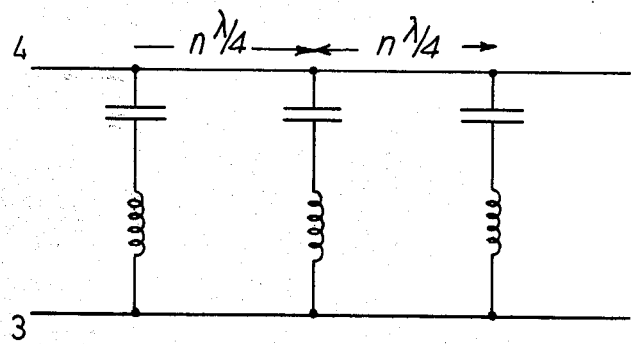

This structure, essentially similar to the one described in relation to FIG. 5a, represents a single section band-rejection filter. As in the structure shown in FIG. 6 it employs a highly efficient resonator. However, single section filters have a gradual rate of cutoff which is insufficient for a great many applications. A much steeper rate of cutoff can be achieved with a multi-section filter which can be realized by the modification shown in FIG. 7b. For simplicity the excitation grating 74 is shown as a simple, short array corresponding to the very weak coupling required for a narrow-band resonator. This is then followed by another array 76 whose center is $n$ λ/4 ($n$ odd) distant, which is in turn followed by another array 77 of similar type and so on. Of course there will be equivalent gratings on the other surface of the strip. The impedance inverting properties of a quarter wave line then results in the well known ladder equivalent network of FIG. 7c. Such a network can be designed to have as steep a rate of cutoff as is desired by employing an appropriate number of sections with correctly chosen parameters.

It is to be understood that the foregoing description of specific examples of this invention is made by way of example only and is not to be considered as a limitation on its scope.

What is claimed is:

1. A surface acoustic wave filter comprising:
a body of piezoelectric material;
means for propagating a first acoustic wave in a first mode in the surface of said body of said material from an input electric signal;
means for converting a portion of the surface wave energy existing in said first acoustic wave into a second acoustic wave in a second mode;
a resonant structure on the surface of said body wherein acoustic wave energy in said second mode is resonant;
means for reconverting acoustic wave energy in said second mode into surface acoustic wave energy in said first mode;
means for introducing a predetermined phase shift of said reconverted acoustic wave energy relative to said propagated first acoustic wave energy; and
means for recovering combined acoustic wave energy of said first and second phase shift reconverted acoustic wave energies as an electric output signal.

2. The device according to claim 1 wherein said means for propagating said first and second acoustic waves and said means for recovering acoustic wave energy comprises at least one interdigital transducer.

3. The device of claim 1 wherein said means for converting acoustic wave energy in a first mode to an acoustic wave in a second mode, and said means for reconverting acoustic wave energy from an acoustic wave in a second mode comprise surface acoustic wave directional coupling elements.

4. The device of claim 3 wherein each of said directional coupling elements comprises a single strip of metal deposited on a piezoelectric metal surface, said strip extending across a first surface acoustic wave propagation path in which acoustic wave energy is propagated in a first mode, and said strip also extending across a second surface acoustic wave propagation path in which said converted acoustic wave energy in said second mode is propagated within said resonant structure.

5. The device according to claim 1 wherein said resonant structure comprises two interdigital transducers each having tuning means to make each of said transducers a totally reflecting termination to an acoustic wave propagation path, said two transducers being separated from each other by a distance capable of causing resonance at a particular frequency at either end of a path passing through said means for converting a portion of said surface acoustic wave energy into an acoustic wave in a second mode, and said means for reconverting acoustic wave energy in said second mode into surface acoustic wave energy in said first mode.

6. The device of claim 2 further including an output transducer and a pair of first and second separate similar resonant structures including associated converting and reconverting means arranged for coupling acoustic wave energy propagated in one direction to said first resonant structure and for coupling acoustic wave energy propagated in an opposite direction to said second resonant structure and wherein the resonant acoustic wave energy in the first of said resonant structures is coupled to the output transducer from one direction while the resonant acoustic wave energy from said second resonant structure is coupled to the output transducer from said opposite direction.

7. The device according to claim 2 further including an input transducer; first, second, third and fourth output transducers; and a pair of first and second different resonant structures with associated converting and reconverting means whereby acoustic energy propagated from said input transducer is coupled in one direction to said first resonant structure and acoustic wave energy propagated in an opposite direction is coupled to said second resonant structure and wherein resonant acoustic wave energy in said first resonant structure is coupled to a third output transducer associated with said first resonant structure and the resonant acoustic wave energy in said second resonant structure is coupled to a fourth output transducer associated with said second resonant structure and wherein each of said third and fourth output transducers receives acoustic wave energy propagated from said input transducer.

8. The device according to claim 2 further including at least one separate input and output transducer coupled to separate surface acoustic wave ports on one side of a multistrip directional coupler and a first pair of separate similar resonant structures with associated converting and reconverting means, each of said two separate resonant structures coupled separately to separate ports on another side of said multistrip coupler.

9. The device of claim 8 further including at least a second pair of resonant structures with associated converting and reconverting means, each of said second pair of resonant structures being coupled to said same ports as said first pair of resonant structures.

* * * * *